(12) United States Patent
Liu (10) Patent No.: US 10,598,707 B2
(45) Date of Patent: Mar. 24, 2020

(54) METHOD, APPARATUS, AND SYSTEM FOR COUNTING ELECTRICITY CONSUMPTION

(71) Applicant: Xiaomi Inc., Beijing (CN)

(72) Inventor: Guoming Liu, Beijing (CN)

(73) Assignee: Xiaomi Inc., Beijing (CN)

(*) Notice: Subject to any disclaimer, the term of this patent is extended or adjusted under 35 U.S.C. 154(b) by 1349 days.

(21) Appl. No.: 14/586,269

(22) Filed: Dec. 30, 2014

(65) Prior Publication Data

US 2015/0346250 A1    Dec. 3, 2015

Related U.S. Application Data

(63) Continuation of application No. PCT/CN2014/089255, filed on Oct. 23, 2014.

(30) Foreign Application Priority Data

May 30, 2014 (CN) .......................... 2014 1 0238910

(51) Int. Cl.
  *G01R 21/133*   (2006.01)
  *G05B 15/02*   (2006.01)
  (Continued)

(52) U.S. Cl.
  CPC .......... *G01R 21/1335* (2013.01); *G01D 1/08* (2013.01); *G01D 4/002* (2013.01); *G05B 15/02* (2013.01);
  (Continued)

(58) Field of Classification Search
  USPC ..................................................... 702/60–65
  See application file for complete search history.

(56) References Cited

U.S. PATENT DOCUMENTS 9,057,746 B1 * 6/2015 Houlette ................ G06Q 50/06
9,152,737 B1 * 10/2015 Micali ................ G06F 16/9024
(Continued)

FOREIGN PATENT DOCUMENTS

CN  101551658 A  10/2009
CN  201562149 U  8/2010
(Continued)

OTHER PUBLICATIONS

Machine Translation for CN101872185 (Year: 2010).*
(Continued)

*Primary Examiner* — Sujoy K Kundu
*Assistant Examiner* — Leonard S Liang
(74) *Attorney, Agent, or Firm* — Finnegan, Henderson, Farabow, Garrett & Dunner, L.L.P.

(57) ABSTRACT

A method for counting electricity consumption includes obtaining a plurality of groups of electricity parameters. Each of the groups of electricity parameters includes a reading of a smart electricity meter and corresponding statuses of smart switches connected to the smart electricity meter. The method also includes determining an average power of at least one of the smart switches according to at least one of the plurality of groups of electricity parameters, determining a working period of the at least one of the smart switches within a set counting period, and determining an electricity consumption of the at least one of the smart switches in the counting period according to the working period and the average power of the at least one of the smart switches.

5 Claims, 6 Drawing Sheets (51) Int. Cl.
*G01D 1/08* (2006.01)
*G01D 4/00* (2006.01)
(52) U.S. Cl.
CPC ......... *Y02B 70/3266* (2013.01); *Y02B 90/241* (2013.01); *Y04S 20/242* (2013.01); *Y04S 20/32* (2013.01)

(56) References Cited

U.S. PATENT DOCUMENTS

| | | | |
|---|---|---|---|
| 9,172,623 B1* | 10/2015 | Micali | H04L 67/12 |
| 9,310,401 B2* | 4/2016 | Tsao | G01R 19/2513 |
| 9,528,854 B1* | 12/2016 | Mixon | G01D 4/004 |
| 2001/0010032 A1 | 7/2001 | Ehlers et al. | |
| 2009/0045804 A1* | 2/2009 | Durling | G01D 4/008 |
| | | | 324/140 R |
| 2009/0094173 A1* | 4/2009 | Smith | G01R 21/1335 |
| | | | 705/412 |
| 2009/0195349 A1 | 8/2009 | Frader-Thompson et al. | |
| 2009/0198384 A1* | 8/2009 | Ahn | G01D 4/004 |
| | | | 700/292 |
| 2009/0222828 A1* | 9/2009 | Lefevre | G01D 4/004 |
| | | | 718/102 |
| 2010/0188262 A1 | 7/2010 | Reymann et al. | |
| 2011/0029655 A1* | 2/2011 | Forbes, Jr. | G06Q 10/00 |
| | | | 709/223 |
| 2011/0184586 A1* | 7/2011 | Asano | G05B 15/02 |
| | | | 700/297 |
| 2011/0196547 A1* | 8/2011 | Park | G06Q 50/06 |
| | | | 700/296 |
| 2011/0282504 A1* | 11/2011 | Besore | H02J 3/14 |
| | | | 700/291 |
| 2012/0016608 A1 | 1/2012 | Ko et al. | |
| 2012/0041795 A1* | 2/2012 | Cabrini | G06Q 10/06 |
| | | | 705/7.11 |
| 2012/0053739 A1 | 3/2012 | Brian et al. | |
| 2012/0203386 A1* | 8/2012 | Fakos | G05B 15/02 |
| | | | 700/291 |
| 2012/0203390 A1* | 8/2012 | Lee | H02J 3/14 |
| | | | 700/295 |
| 2013/0110621 A1 | 5/2013 | Gupta et al. | |
| 2013/0132008 A1* | 5/2013 | Borean | G01D 4/00 |
| | | | 702/60 |
| 2013/0151024 A1* | 6/2013 | Bae | H02J 3/14 |
| | | | 700/295 |
| 2013/0262197 A1* | 10/2013 | Kaulgud | G05B 13/02 |
| | | | 705/14.1 |
| 2013/0345884 A1* | 12/2013 | Forbes, Jr. | G05B 15/02 |
| | | | 700/286 |
| 2013/0345888 A1* | 12/2013 | Forbes, Jr. | H02J 3/14 |
| | | | 700/291 |
| 2014/0097758 A1* | 4/2014 | Recker | H05B 37/0272 |
| | | | 315/152 |
| 2014/0121849 A1* | 5/2014 | Ansari | H02J 3/383 |
| | | | 700/295 |
| 2014/0277813 A1* | 9/2014 | Powell | H02J 3/1821 |
| | | | 700/298 |
| 2015/0270743 A1* | 9/2015 | Orthlieb | H02J 3/00 |
| | | | 165/288 |

FOREIGN PATENT DOCUMENTS

| | | | |
|---|---|---|---|
| CN | 101872185 A | * | 10/2010 |
| CN | 101872185 A | | 10/2010 |
| CN | 102013156 A | | 4/2011 |
| CN | 102193013 A | | 9/2011 |
| CN | 102509162 A | | 6/2012 |
| CN | 102546257 A | | 7/2012 |
| CN | 102591276 A | | 7/2012 |
| CN | 102735955 A | | 10/2012 |
| CN | 203275957 U | | 11/2013 |
| CN | 103490880 A | | 1/2014 |
| CN | 103744385 A | | 4/2014 |
| CN | 104111641 A | | 10/2014 |
| JP | 2002-092410 A | | 3/2002 |
| JP | 2004-257897 A | | 9/2004 |
| JP | 2009-047682 A | | 3/2009 |
| JP | 2009047682 A | * | 3/2009 |
| JP | 2011102670 A | | 5/2011 |
| JP | 2012-39727 A | | 2/2012 |
| JP | 2013-059256 A | | 3/2013 |
| KR | 20110093461 A | * | 8/2011 |
| SU | 1780022 A1 | | 11/1969 |
| TW | 201331595 A1 | | 8/2013 |
| WO | WO 2012/073610 A1 | | 10/2011 |
| WO | WO-2012081750 A1 | * | 6/2012 ............... H02J 3/14 |

OTHER PUBLICATIONS

Machine Translation for JP2009047682 (Year: 2009).*
Machine Translation for KR20110093461 (Year: 2011).*
English version of International Search Report for PCT International Application No. PCT/CN2014/089255, from the State Intellectual Property Office of the P.R. China, dated Mar. 6, 2015.
Extended European Search Report for European Application No. EP 15162618.1 from the European Patent Office, dated Oct. 23, 2015.
International Search Report of International Patent Application No. PCT/CN2014/089255, from the State Intellectual Property Office of China (ISA/CN), dated Mar. 6, 2015 (5 pages).

* cited by examiner

Fig. 1a

Sampling readings of the smart electricity meter and statuses of the smart switches according to a set sampling time interval to obtain a plurality of groups of electricity parameters Determining an average power of each smart switch according to a part or all of the plurality of groups of electricity parameters Determining a working period of each smart switch within a set counting period Determining an electricity consumption of each smart switch within the counting period according to the working period and the average power of the smart switch

METHOD, APPARATUS, AND SYSTEM FOR COUNTING ELECTRICITY CONSUMPTION

CROSS-REFERENCE TO RELATED APPLICATIONS

This application is a Continuation of International Application No. PCT/CN2014/089255, filed on Oct. 23, 2014, which is based upon and claims priority to Chinese Patent Application No. 201410238910.3, filed on May 30, 2014, the entire contents of both of which are incorporated herein by reference.

TECHNICAL FIELD

The present disclosure generally relates to smart homes and, more particularly, to a method, an apparatus, and a system for counting electricity consumption.

BACKGROUND

In a smart home system, a control center is generally required to control and query various devices connected thereto. Therefore, the control center and every connected device have to be always kept in a powered-up state. Statistical analysis of electricity consumption respectively for all connected devices is needed to identify electricity usage of each connected device from time to time.

In conventional technology, a switch with electricity meter is used to count electricity consumption of a device controlled by the switch. In the smart home system, a switch with electricity meter may be used for every connected device to monitor the electricity consumption of every connected device. After that, a user may read respective electricity meters, and then perform a statistical analysis of electricity usage for every connected device.

However, in the above manner, the number of connected devices corresponds to the number of switches with electricity meter. That is, if there are N connected devices, N switches each having an electricity meter need to be installed, and thus N electricity meters are required. Therefore, the number of required electricity meters is relative larger, which results in a certain waste. Moreover, each electricity meter has to be read manually before corresponding statistics are made, which requires more effort from the user and causes inconvenient operation.

SUMMARY

In accordance with the present disclosure, there is provided a method for counting electricity consumption. The method includes obtaining a plurality of groups of electricity parameters. Each of the groups of electricity parameters includes a reading of a smart electricity meter and corresponding statuses of smart switches connected to the smart electricity meter. The method also includes determining an average power of at least one of the smart switches according to at least one of the plurality of groups of electricity parameters, determining a working period of the at least one of the smart switches within a set counting period, and determining an electricity consumption of the at least one of the smart switches in the counting period according to the working period and the average power of the at least one of the smart switches.

Also in accordance with the present disclosure, there is provided an apparatus for counting electricity consumption. The apparatus includes a processor and a non-transitory computer-readable storage medium storing instructions. The instructions, when executed by the processor, cause the processor to obtain a plurality of groups of electricity parameters. Each of the groups of electricity parameters includes a reading of a smart electricity meter and corresponding statuses of smart switches connected to the smart electricity meter. The instructions also cause the processor to determine an average power of at least one of the smart switches according to at least one of the plurality of groups of electricity parameters, determine a working period of the at least one of the smart switches within a set counting period, and determine an electricity consumption of the at least one of the smart switches in the counting period according to the working period and the average power of the at least one of the smart switches.

Also in accordance with the disclosure, there is provided a non-transitory computer-readable storage medium storing instructions. The instructions, when executed by one or more processors, cause the one or more processors to obtain a plurality of groups of electricity parameters. Each of the groups of electricity parameters includes a reading of a smart electricity meter and corresponding statuses of smart switches connected to the smart electricity meter. The instructions also cause the one or more processors to determine an average power of at least one of the smart switches according to at least one of the plurality of groups of electricity parameters, determine a working period of the at least one of the smart switches within a set counting period, and determine an electricity consumption of the at least one of the smart switches in the counting period according to the working period and the average power of the at least one of the smart switches.

It should be understood that, both the general description above and the detailed description below are merely exemplary and explanatory, and do not limit the present disclosure.

The accompanying drawings, which are incorporated in and constitute a part of this specification, illustrate several embodiments of the invention and together with the description, serve to explain the principles of the invention.

DETAILED DESCRIPTION

Embodiments consistent with the present disclosure include a method, apparatus, and system for counting electricity consumption.

Figure 1:
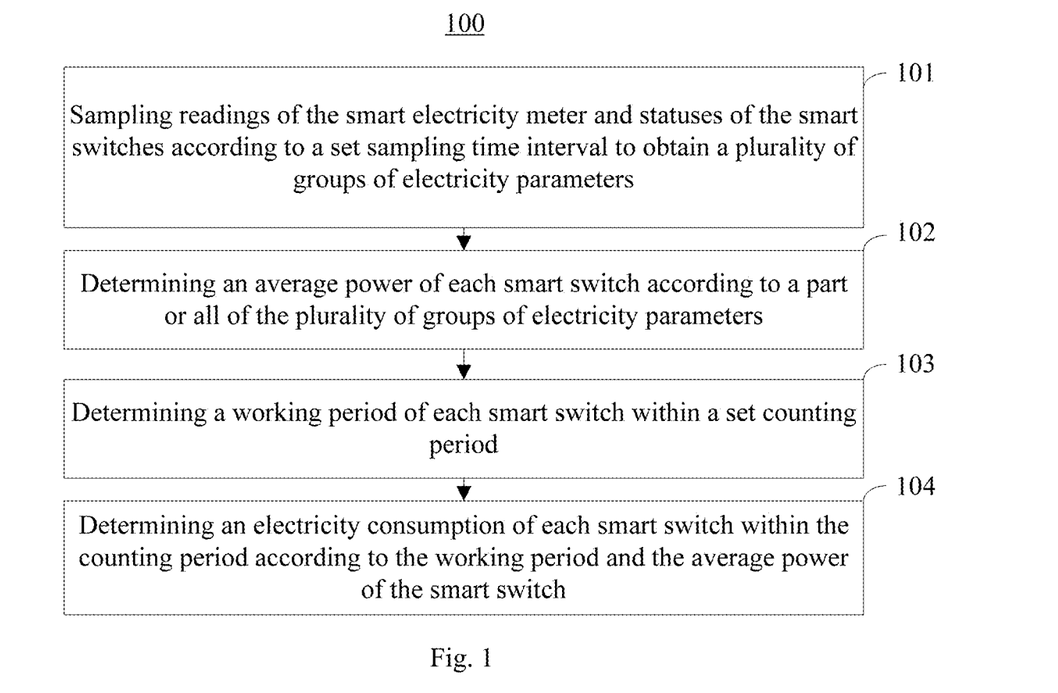
FIG. 1 illustrates a flow chart of a method for counting electricity consumption according to an exemplary embodiment.
Figure 1A:
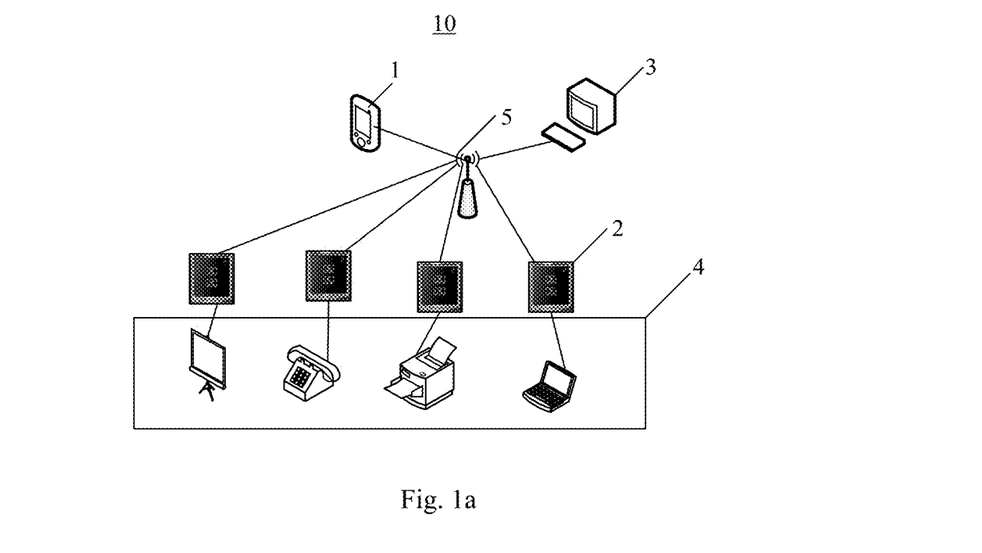
FIG. 1a illustrates a block diagram of an application scenario shown by disclosed embodiments.

FIG. 1a schematically illustrates a system 10 consistent with embodiments of the present disclosure. The system 10 includes a smart electricity meter 1, a plurality of smart switches 2, a terminal 3, and a wireless access point 5. Each of the smart switches 2 is connected with one or more electronic devices 4. The smart switches 2 are connected with the smart electricity meter 1. The smart switches 2 and the smart electricity meter 1 are wirelessly connected with the terminal 3 via the wireless access point 5.

The terminal 3 is provided with, for example, one of apparatuses described below in connection with FIGS. 4, 5, and 7. The smart electricity meter 1, the smart switches 2, and the terminal 3 are each provided with a wireless communication module, so that they can be connected with each other via a wireless network (e.g., WIFI). Therefore, the terminal 3 can perform interoperation among them, such as data exchange or control operation.

The electronic devices 4 may be any kinds of household appliances, such as TV sets, telephones, notebook computers, printers, fax machines, and so on.

FIG. 1 illustrates a flow chart of an exemplary method 100 for counting electricity consumption consistent with embodiments of the disclosure. The method 100 may, for example, be executed in the terminal 3 for counting electricity consumption of the electronic devices 4 using the smart electricity meter 1.

As shown in FIG. 1, at 101, readings of the smart electricity meter 1 and statuses of the smart switches 2 are sampled at a set sampling time interval to obtain a plurality of groups of electricity parameters. Each of the plurality of groups of electricity parameters includes a reading of the smart electricity meter 1 and the statuses of the smart switches 2. At 102, an average power of each smart switch 2 is determined according to a part or all of the plurality of groups of electricity parameters. At 103, a working period of each smart switch 2 within a set counting period is determined.

The status of each smart switch 2 is an on-state or an off-state. The on-state and off-state of the smart switch 2 respectively correspond to an on-state and an off-state of the electronic device 4 connected thereto. According to the present disclosure, one smart switch 2 may control one electronic device 4, such as a refrigerator or a water heater, or a plurality of electronic devices 4, such as cell phones and cameras relying on rechargeable batteries.

The working period of a smart switch 2 refers to a total time period within which the smart switch 2 is in the on-state. The counting period refers to a time period for counting the electricity consumption. The working period is shorter than or equal to the counting period. Within the counting period, a smart switch 2 may be turned on and off repeatedly, or may be kept in the on-state throughout the entire counting period. If the smart switch 2 is turned on and off repeatedly, its working period is shorter than the counting period. On the other hand, if the smart switch 2 is kept in the on-state, its working period equals the counting period. The counting period may be set manually, for example, to one week or one month, or the like.

At 104, an electricity consumption of each smart switch 2 within the counting period is determined according to the working period and the average power of the smart switch 2.

Figure 2:
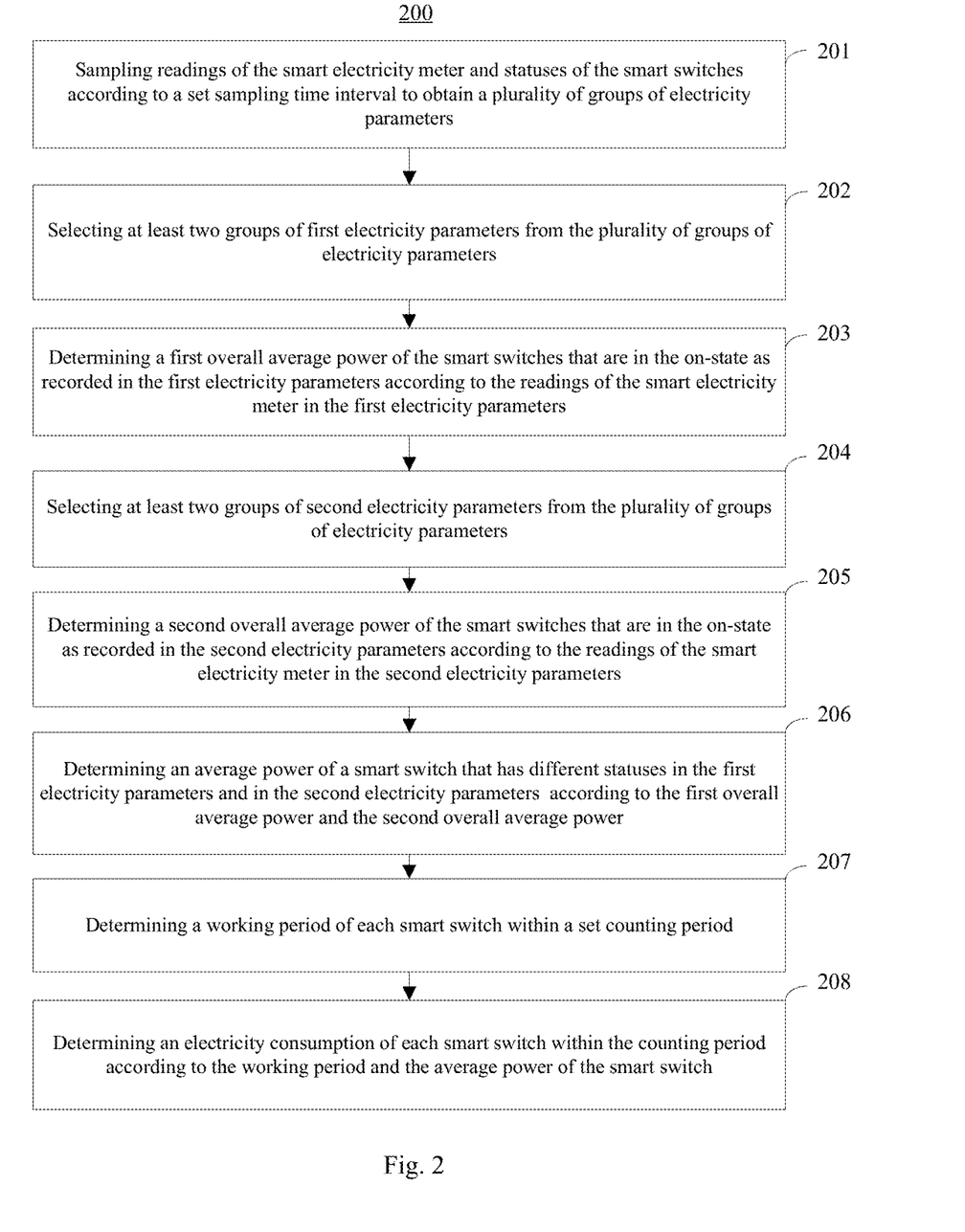
FIG. 2 illustrates a flow chart of a method for counting electricity consumption according to an exemplary embodiment.

FIG. 2 illustrates a flow chart of an exemplary method 200 for counting electricity consumption consistent with embodiments of the disclosure. The method 200 may, for example, be executed in the terminal 3 for counting electricity consumption of the electronic devices 4 using the smart electricity meter 1.

As shown in FIG. 2, at 201, readings of the smart electricity meter 1 and statuses of the smart switches 2 are sampled at a set sampling time interval to obtain a plurality of groups of electricity parameters. Each of the plurality of groups of electricity parameters includes a reading of the smart electricity meter 1 and the statuses of the smart switches 2.

In some embodiments, each of the plurality of groups of electricity parameters may further include a sampling time interval. The sampling time interval may be set manually, for example, to 5 seconds, 30 seconds, 1 minute, or the like.

In some embodiments, an irregular sampling time interval may be employed. In this scenario, every sampling time interval needs to be recorded correspondingly. A shorter sampling time interval requires more sampled data in a same processing time period than a longer sampling time interval, and provides a more accurate result.

In some embodiments, the smart switches 2 are numbered. The readings of the smart electricity meter 1, the statuses of each smart switch 2, and the sampling time interval in each group may be stored in the form of a list.

Due to a user's habits or the nature of electronic devices 4, not all of the electronic devices 4 change status during their operation. For example, a refrigerator may not be turned off for a relatively long time period (e.g., more than 3 years) after it is turned on. Smart switches 2 controlling such kind of electronic devices may be classified as a special type. In this scenario, at 201, the statuses of the smart switches 2 of the special type are not sampled but the statuses of the other smart switches 2 are sampled. As one of ordinary skill in the art would understand, if there are N smart switches 2, one of which is the special type, then when the statuses of the other N−1 smart switches 2 vary simultaneously, the electricity consumption of the special type smart switch 2 can be determined. Alternatively, a method shown in FIG. 3 can be used.

Referring again to FIG. 2, at 202, at least two first groups of electricity parameters are selected from the plurality of groups of electricity parameters. The at least two first groups of electricity parameters are sampled successively, and the status of each smart switch 2 in the first groups of electricity parameters does not change.

At 203, a first overall average power of the smart switches 2 that are in the on-state as recorded in the first groups of electricity parameters is determined according to the readings of the smart electricity meter 1 in the first groups of electricity parameters.

In some embodiments, among the at least two first groups of electricity parameters, the reading of the smart electricity meter 1 that is sampled first is set as a first reading, and the reading of the smart electricity meter 1 that is sampled last is set as a second reading. The first overall average power is calculated by dividing an absolute value of a difference between the first and second readings by a length of a total sampling time period for the at least two first groups of electricity parameters.

In some embodiments, to improve accuracy, sampled data in the at least two first groups of electricity parameters may be filtrated before calculating the absolute value of the difference between the first and second readings. For example, data of one or more groups of electricity parameters with a larger deviation may be removed.

At 204, at least two second groups of electricity parameters are selected from the plurality of groups of electricity parameters. The at least two groups of second groups of electricity parameters are sampled successively, and the status of each smart switch 2 in the second groups of electricity parameters does not change. However, at least one of the statuses in the second groups of electricity parameters is different from a corresponding status in the first groups of electricity parameters. In some embodiments, one of the statuses in the second groups of electricity parameters is different from the corresponding status in the first groups electricity parameters.

At 205, a second overall average power of the smart switches 2 that are in the on-state as recorded in the second groups of electricity parameters is determined according to the readings of the smart electricity meter 1 in the second groups of electricity parameters.

In some embodiments, among the at least two second groups of electricity parameters, the reading of the smart electricity meter 1 that is sampled first is set as a third reading, and the reading of the smart electricity meter 1 that is sampled last is set as a fourth reading. The second overall average power is calculated by dividing an absolute value of a difference between the third and fourth readings by a length of a total sampling time period for the at least two second groups of electricity parameters.

At 206, an average power of a smart switch 2 that has a different status in the second groups of electricity parameters than in the first groups of electricity parameters is determined according to the first overall average power and the second overall average power.

When there are enough sampling data, a plurality of groups of electricity parameters that satisfy the requirements may be available for selection in both 202 and 204. That is, 202 and 204 may be repeated multiple times, to obtain a plurality of first overall average powers and a plurality of second overall average powers. In this scenario, at 206, the average power of the smart switch 2 that has a different status in the second groups of electricity parameters than in the first groups of electricity parameters can be determined according to the plurality of first and second overall average powers.

202-206 described above provide a method for determining the average power of any one smart switch 2. In some embodiments, 202-206 may be repeated to obtain the average power of each smart switch 2.

At 207, a working period of each smart switch 2 within a set counting period is determined. In some embodiments, it is monitored whether a turning-on instruction for turning on a smart switch 2 is detected. When the turning-on instruction is detected, the corresponding smart switch 2 is turned on, and a timer corresponding to the turned-on smart switch 2 starts timing. In some embodiments, one timer corresponds to one smart switch 2. Further, it is monitored whether a turning-off instruction for turning off a smart switch 2 is detected. When the turning-off instruction is detected, the corresponding smart switch 2 turns off, and the timer corresponding to the turned-off smart switch 2 stops timing. Then, it is determined whether the counting period ends. If so, a reading of the timer is taken, which is used to determine the working period of each smart switch 2.

According to the present disclosure, a timer may be directly built into a corresponding smart switch 2, or may be provided in the terminal 3.

In some embodiments, detecting the turning-on instruction and starting the timer are performed before 201, and detecting the turning-off instruction and stopping the timer are performed simultaneously with 201.

At 208, an electricity consumption of each smart switch 2 within the counting period is determined according to the working period and the average power of the smart switch 2. The electricity consumption of a smart switch 2 equals a product of the average power of each smart switch 2 and the working period thereof.

An example is described below to demonstrate 202-208 in FIG. 2.

Assume there are a smart electricity meter A and three smart switches S1, S2, and S3. The three smart switches are connected with a TV set, a telephone, and a printer, respectively. In order to count an electricity consumption of the TV set, the telephone, and the printer within one day, sampling starts from 08:00. In the meantime, timers respectively connected with the smart switches S1, S2, and S3 are controlled to start timing. The sampling time interval is 30 second. Electricity parameters obtained by sampling are as follows (the unit for reading of the smart electricity meter is KWh). (1) Reading of A: 0.01; status of S1, S2, S3: on, on, on. (2) Reading of A: 0.02, status of S1, S2, S3: on, on, on. (3) Reading of A: 0.03; status of S1, S2, S3: on, on, on. (4) Reading of A: 0.035; status of S1, S2, S3: off, on, on. (5) Reading of A: 0.04; status of S1, S2, S3: off, on, on. (6) Reading of A: 0.05; status of S1, S2, S3: on, on, on. (7) Reading of A: 0.055; status of S1, S2, S3: on, off, on. (8) Reading of A: 0.06; status of S1, S2, S3: on, off, on; (9) Reading of A: 0.065; status of S1, S2, S3: on, on, off. (10) Reading of A: 0.07; status of S1, S2, S3: on, on, off.

For example, if one needs to determine the electricity consumption of the smart switch S3 that controls the printer in one day, any combination of (1) and (2), (2) and (3), or (1), (2), and (3) may be selected at 202. If the combination of (1) and (2) is selected, then at 203, the first overall average power within 1 minute from 08:00-08:01 is determined by (0.02−0.01)/1 min. In order to determine the second overall average power, a combination of (9) and (10) should be selected at 204, and the second overall average power is determined by (0.07−0.065)/1 min at 205. At 206, the average power of the smart switch S3 is calculated to be 0.005/min. Assuming that the reading of the timer corresponding to the smart switch S3 in one day is 240 min, i.e., the total time that the smart switch S3 is in the on-state in one day is 240 min, then the electricity consumption of the smart switch S3 in one day is 240 min×0.005/min, that is, 1.2 KWh.

Figure 3:
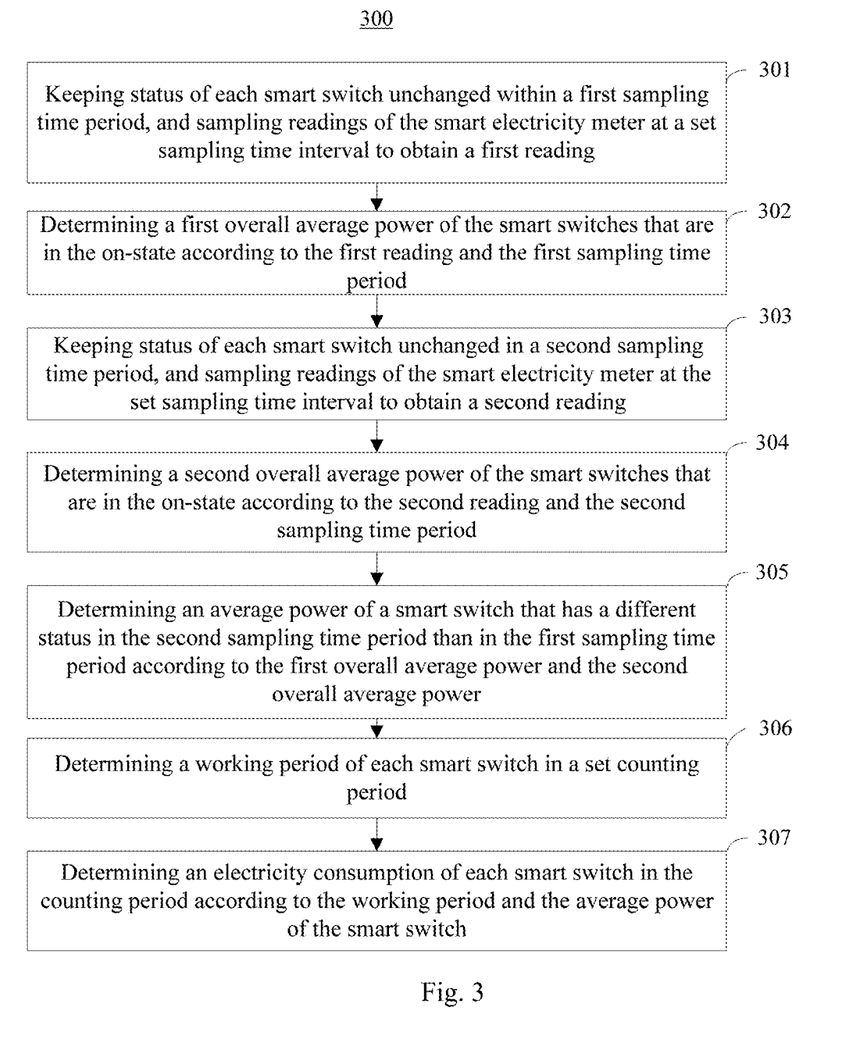
FIG. 3 illustrates a flow chart of a method for counting electricity consumption according to an exemplary embodiment.

FIG. 3 illustrates a flow chart of an exemplary method 300 for counting electricity consumption consistent with embodiments of the disclosure. The method 300 may, for example, be executed in the terminal 3 for counting electricity consumption of the electronic devices 4 using the smart electricity meter 1.

As shown in FIG. 3, at 301, status of each smart switch 2 is kept unchanged in a first sampling time period, and readings of the smart electricity meter 1 are sampled at a set sampling time interval to obtain a first reading. A length of the first sampling time period is greater than that of the sampling time interval. That is, the electricity parameters may be sampled at the set sampling time interval at least twice, in the first sampling time period. In some embodiments, each group of electricity parameters may further include the sampling time interval.

At 302, a first overall average power of the smart switches 2 that are in the on-state is determined according to the first reading and the first sampling time period. This first overall average power can be determined in a same manner as determining the first overall average power in 203 of method 200, details of which are omitted here.

At 303, the status of each smart switch 2 is kept unchanged in a second sampling time period, and readings of the smart electricity meter 1 are sampled at the set sampling time interval to obtain a second reading. At least one of the statuses sampled during the second sampling time period is different from a corresponding status sampled during the first sampling time period. A length of the second sampling period is greater than that of the sampling time interval. That is, the electricity parameters may be sampled at the set sampling time interval at least twice within the second sampling period.

In some embodiments, the status of each smart switch 2 can be controlled by on-off control instructions, which include a turning-on instruction and a turning-off instruction. The turning-on instruction is used to turn on a smart switch 2, while the turning-off instruction is used to turn off a smart switch 2.

At 304, a second overall average power of the smart switches 2 that are in the on-state is determined according to the second reading and the second sampling time period.

In some embodiments, 301 and 303 of the method 300 may be repeated to obtain a plurality of first and second readings. Accordingly, a plurality of first and second overall average powers may be determined, so as to enhance the accuracy of the result.

At 305, an average power of a smart switch 2 that has a different status in the second sampling time period than in the first sampling time period is determined according to the first overall average power and the second overall average power.

301-305 described above provide a method for determining the average power of any one smart switch 2. In some embodiments, 301-305 may be repeated to obtain the average power of each smart switch 2.

For example, at 301, statuses of the smart switches S1, S2, and S3 described above are kept in on-state within a time period of 08:00-08:01. In the meantime, sampling is conducted twice at a sampling time interval of 30 seconds, and a first reading of the smart electricity meter A described above is taken. Determination of the first overall average power in 302 is similar to that in 203 of the method 200. At 303, statuses of the smart switches S1, S2, and S3 are respectively controlled to be on, on, and off, within a time period of 08:02-08:04. Determinations of the second overall average power and the average power in 304 and 305 are similar to those in 205 and 206 of the method 200.

At 306, a working period of each smart switch 2 in a set counting period is determined. At 307, an electricity consumption of each smart switch 2 in the counting period is determined according to the working period and the average power of the smart switch 2. 306 and 307 are similar to 207 and 208 of the method 200 described above, details of which are omitted here.

It is noted that, in the method 300, determination of the average power of each smart switch is finished before counting the electricity consumption.

Figure 4:
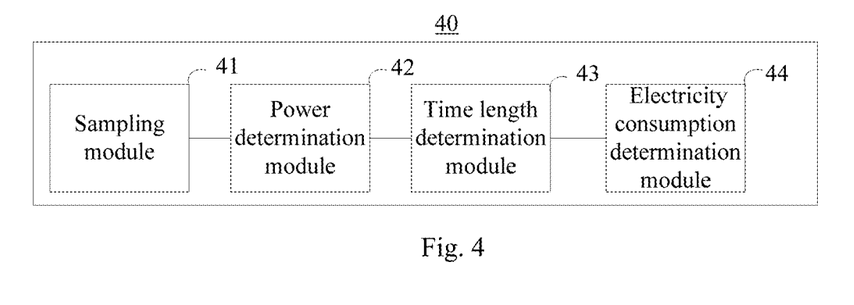
FIG. 4 illustrates a block diagram of an apparatus for counting electricity consumption according to an exemplary embodiment.

FIG. 4 illustrates a block diagram of an exemplary apparatus 40 for counting electricity consumption consistent with embodiments of the disclosure. As shown in FIG. 4, the apparatus 40 includes a sampling module 41, a power determination module 42, a time length determination module 43, and an electricity consumption determination module 44.

The sampling module 41 is configured to sample readings of the smart electricity meter 1 and statuses of the smart switches 2 at a set sampling time interval to obtain a plurality of groups of electricity parameters. Each of the plurality of groups of electricity parameters includes a reading of the smart electricity meter 1 and statuses of the smart switches 2.

The power determination module 42 is configured to determine an average power of each smart switch 2 according to a part or all of the plurality of groups of electricity parameters.

The time length determination module 43 is configured to determine a working period of each smart switch 2 in a set counting period.

The electricity consumption determination module 44 is configured to determine an electricity consumption of each smart switch 2 in the counting period according to the working period and the average power of the smart switch 2.

Figure 5:
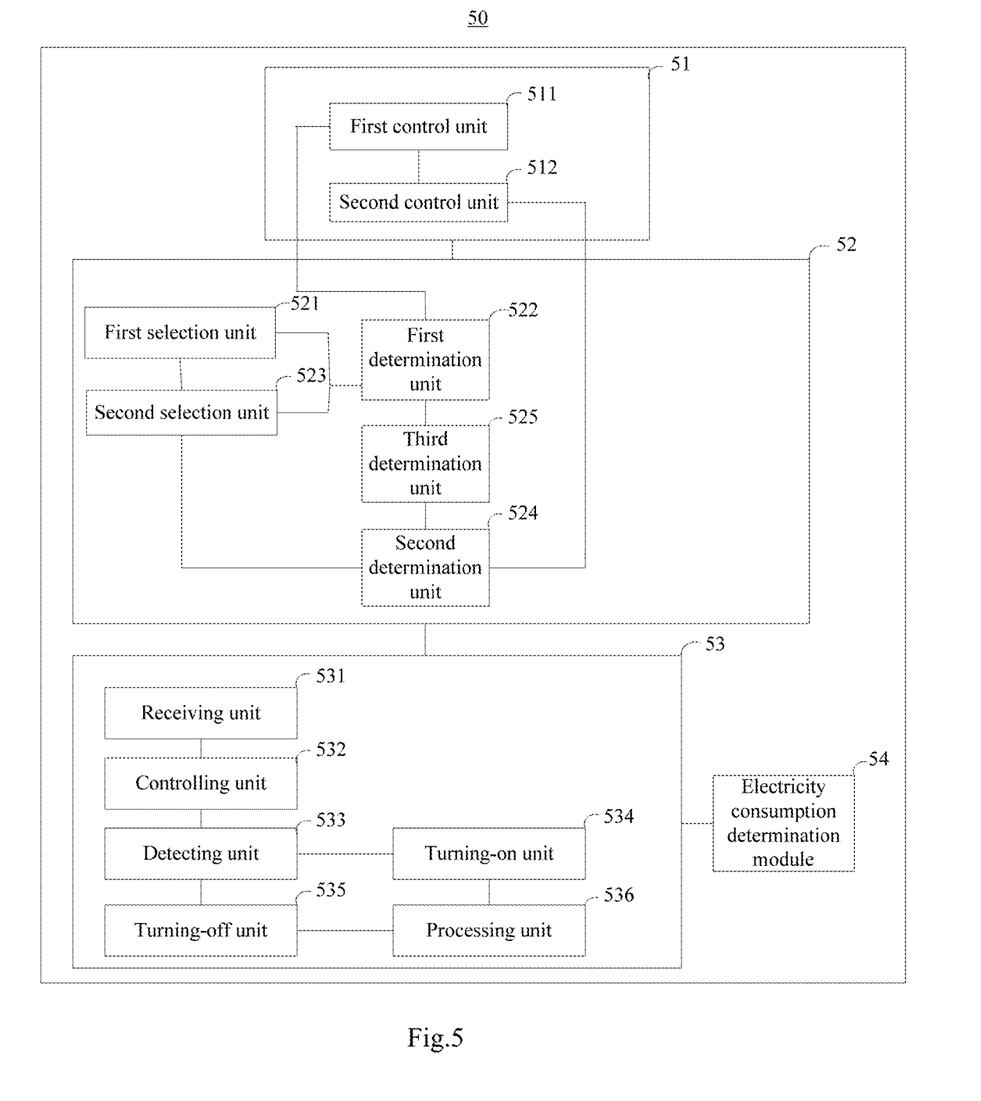
FIG. 5 illustrates a block diagram of an apparatus for counting electricity consumption according to an exemplary embodiment.

FIG. 5 illustrates a block diagram of an exemplary apparatus 50 for counting electricity consumption consistent with embodiments of the disclosure. As shown in FIG. 5, the apparatus 50 includes a sampling module 51, a power determination module 52, a time length determination module 53, and an electricity consumption determination module 54.

The sampling module 51 is configured to sample readings of the smart electricity meter 1 and statuses of the smart switches 2 at a set sampling time interval to obtain a plurality of groups of electricity parameters. Each of the plurality of groups of electricity parameters includes a reading of the smart electricity meter 1 and statuses of the smart switches 2. The power determination module 52 is configured to determine an average power of each smart switch 2 according to a part or all of the plurality of groups of electricity parameters. The time length determination module 53 is configured to determine a working period of each smart switch 2 in a set counting period. The electricity consumption determination module 54 is configured to determine an electricity consumption of each smart switch 2 in the counting period according to the working period and the average power of the smart switch 2.

As shown in FIG. 5, the sampling module 51 includes a first control unit 511 and a second control unit 512. The first control unit 511 is configured to control status of each smart switch 2 to be kept unchanged in a first sampling time period, and to sample readings of the smart electricity meter 1 at a set sampling time interval to obtain a first reading. The second control unit 512 is configured to control status of each smart switch 2 to be kept unchanged in a second sampling time period, and to sample readings of the smart electricity meter 1 at the set sampling time interval to obtain a second reading. At least one of the statuses sampled during the second sampling time period is different from a corresponding status sampled during the first sampling time period.

The power determination module 52 includes a first selection unit 521, a first determination unit 522, a second selection unit 523, a second determination unit 524, and a third determination unit 525.

The first selection unit 521 is configured to select at least two first groups of electricity parameters from the plurality of groups of electricity parameters. The at least two first groups of electricity parameters are sampled successively, and the status of each smart switch 2 in the first groups of electricity parameters does not change.

The first determination unit 522 is configured to determine a first overall average power of the smart switches 2 that are in the on-state as recorded in the first groups of electricity parameters according to the readings of the smart electricity meter 1 in the first groups of electricity parameters. In some embodiments, the first overall average power is determined according to the first reading and the first sampling time period provided by the first control unit 511.

The second selection unit 523 is configured to select at least two second groups of electricity parameters from the plurality of groups of electricity parameters. The at least two groups of second groups of electricity parameters are sampled successively, and the status of each smart switch 2 in the second groups of electricity parameters does not change. At least one of the statuses in the second groups of electricity parameters is different from a corresponding status in the first groups of electricity parameters.

The second determination unit 524 is configured to determine a second overall average power of the smart switches 2 that are in the on-state as recorded in the second groups of electricity parameters according to the readings of the smart electricity meter 1 in the second groups of electricity parameters. In some embodiments, the second overall average power is determined according to the second reading and the second sampling time period provided by the second control unit 512.

The third determination unit 525 is configured to determine an average power of a smart switch 2 that has a different status in the second groups of electricity parameters than in the first groups of electricity parameters according to the first overall average power and the second overall average power. In some embodiments, the third determination unit 525 is further configured to determine an average power of a smart switch 2 that has a different status in the second sampling time period than in the first sampling time period according to the first overall average power and the second overall average power.

The time length determination module 53 includes a receiving unit 531, a controlling unit 532, a detecting unit 533, a turning-on unit 534, a turning-off unit 535, and a processing unit 536.

The receiving unit 531 is configured to receive on-off control instructions, which include a turning-on instruction and a turning-off instruction. The controlling unit 532 is configured to control status of each smart switch 2 according to the on-off control instructions. The detection unit 533 is configured to detect whether a turning-on instruction to turn on a smart switch 2 is received or whether a turning-off instruction to turn off a smart switch 2 is received. The turning-on unit 534 is configured to turn on the smart switch 2 when the turning-on instruction is detected, and to start timing of a timer corresponding to the turned-on smart switch 2. The timer is provided in a one-to-one correspondence with the smart switch 2. The turning-off unit 535 is configured to turn off the smart switch 2 when the turning-off instruction is detected, and to stop timing of the timer corresponding to the turned-off smart switch. The processing unit 536 is configured to determine whether the counting period has ended, and if so, take readings of the timers and determine the working periods of the smart switches 2 according to the readings of the timers.

Operations of each module and unit in the apparatus 50 are similar to the methods described above in connection with FIGS. 1-3, and thus detailed description thereof is omitted here.

Figure 6:
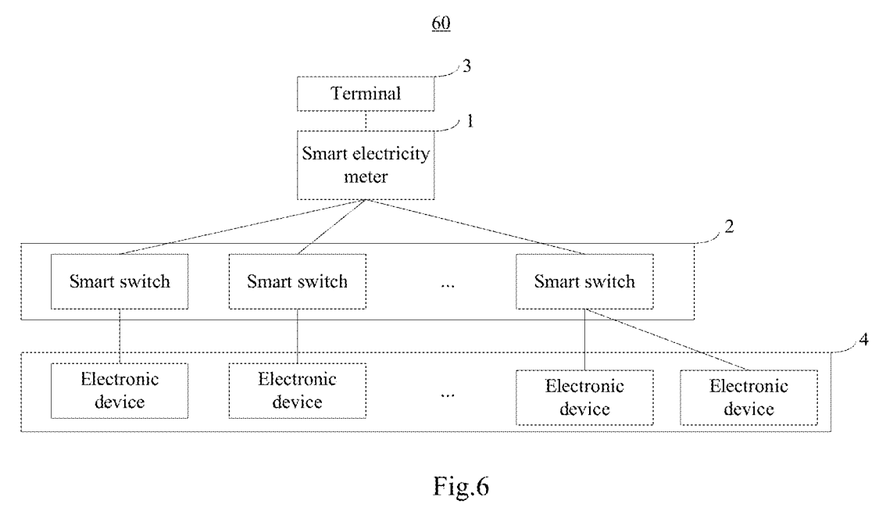
FIG. 6 illustrates a block diagram of a system for counting electricity consumption according to an exemplary embodiment.

FIG. 6 illustrates a block diagram of an exemplary system 60 for counting electricity consumption consistent with embodiments of the disclosure. As shown in FIG. 6, the system 60 includes the smart electricity meter 1, the smart switches 2, the terminal 3, and the electronic devices 4. Each of the smart switches 2 is connected with the smart electricity meter 1 and is connected with one or more of the electronic devices 4. The smart switches 2 and the smart electricity meter 1 are connected, for example, wirelessly with the terminal 3. The terminal 3 is includes an apparatus for counting electricity consumption according to the present disclosure, such as the apparatus 40 or 50 shown in FIG. 4 or 5.

In some embodiments, the smart electricity meter 1, the smart switches 2, and the terminal 3 are each provided with a wireless communication module, and therefore can be connected with each other via a wireless network (e.g., WIFI). The electronic devices 4 may include different kinds of household appliances, such as TV sets, telephones, fax machines, or notebook computers.

Figure 7:
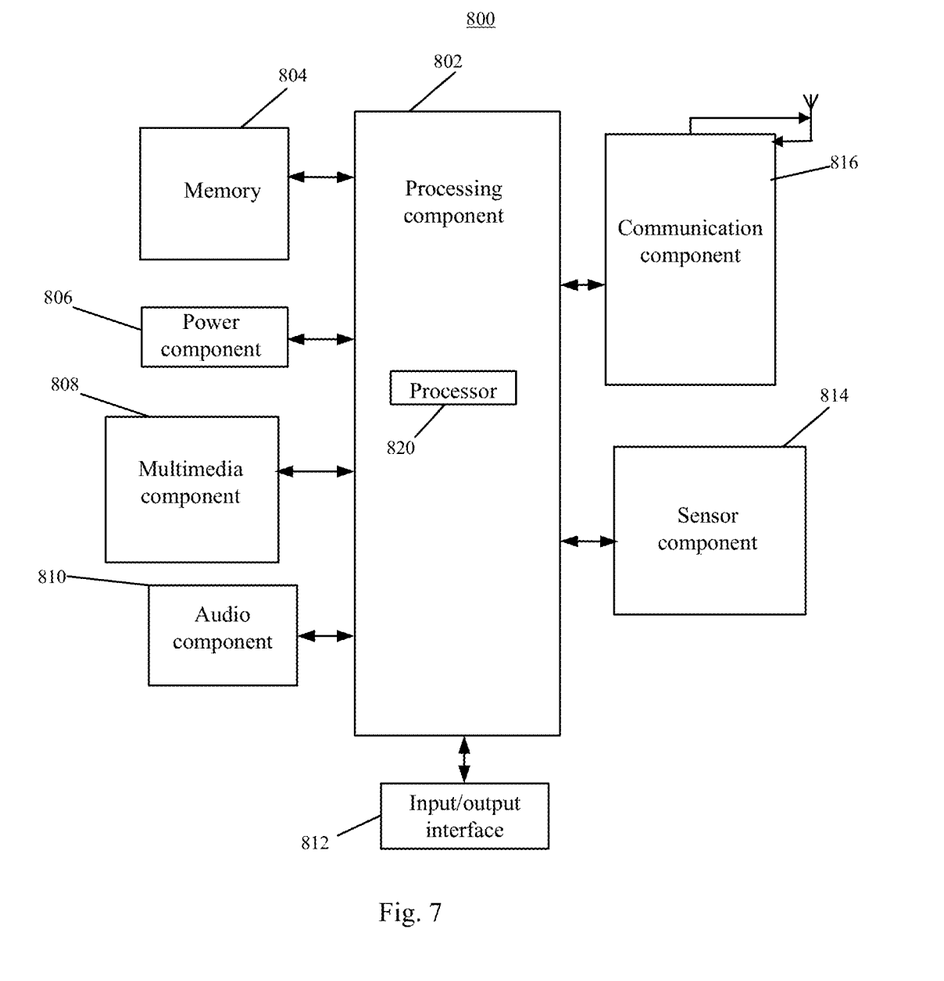
FIG. 7 illustrates a block diagram of an apparatus according to an exemplary embodiment.

FIG. 7 is a block diagram of an exemplary apparatus 800 for counting electricity consumption consistent with embodiments of the disclosure. For example, the apparatus 800 may be a mobile phone, a computer, a digital broadcast terminal, a message sending and receiving device, a game console, a tablet device, medical equipment, fitness equipment, a personal digital assistant, etc.

As shown in FIG. 7, the apparatus 800 includes a processing component 802, a memory 804, a power component 806, a multimedia component 808, an audio component 810, an input/output (I/O) interface 812, a sensor component 814, and a communication component 816.

Th processing component 802 typically controls overall operations of the apparatus 800, such as the operations associated with display, telephone calls, data communications, camera operations, and recording operations. The processing component 802 may include one or more processors 820 to execute instructions to perform all or part of the methods consistent with embodiments of the disclosure. Moreover, the processing component 802 may include one or more modules which facilitate the interaction between the processing component 802 and other components. For instance, the processing component 802 may include a multimedia module to facilitate the interaction between the multimedia component 808 and the processing component 802.

The memory 804 is configured to store various types of data to support the operation of the apparatus 800. Examples of such data include instructions for any applications or methods operated on the apparatus 800, contact data, phonebook data, messages, pictures, video, etc. The memory 804 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, or a magnetic or optical disk.

The power component 806 provides power to various components of the apparatus 800. The power component 806 may include a power management system, one or more power sources, and any other components associated with the generation, management, and distribution of power in the apparatus 800.

The multimedia component 808 includes a screen providing an output interface between the apparatus 800 and the user. In some embodiments, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. In some embodiments, the multimedia component 808 includes a front camera and/or a rear camera. The front camera and the rear camera may receive an external multimedia datum while the apparatus 800 is in an operation mode, such as a photographing mode or a video mode. Each of the front camera and the rear camera may be a fixed optical lens system or have focus and optical zoom capability.

The audio component 810 is configured to output and/or input audio signals. For example, the audio component 810 includes a microphone ("MIC") configured to receive an external audio signal when the apparatus 800 is in an operation mode, such as a call mode, a recording mode, and a voice recognition mode. The received audio signal may be further stored in the memory 804 or transmitted via the communication component 816. In some embodiments, the audio component 810 further includes a speaker to output audio signals.

The I/O interface 812 provides an interface between the processing component 802 and peripheral interface modules, such as a keyboard, a click wheel, buttons, and the like. The buttons may include, but are not limited to, a home button, a volume button, a starting button, and a locking button.

The sensor component 814 includes one or more sensors to provide status assessments of various aspects of the apparatus 800. For instance, the sensor component 814 may detect an open/closed status of the apparatus 800, relative positioning of components, e.g., the display and the keypad, of the apparatus 800, a change in position of the apparatus 800 or a component of the apparatus 800, a presence or absence of user contact with the apparatus 800, an orientation or an acceleration/deceleration of the apparatus 800, and a change in temperature of the apparatus 800. The sensor component 814 may include a proximity sensor configured to detect the presence of nearby objects without any physical contact. The sensor component 814 may further include a light sensor, such as a CMOS or CCD image sensor, for use in imaging applications. In some embodiments, the sensor component 814 may further include an accelerometer sensor, a gyroscope sensor, a magnetic sensor, a pressure sensor, or a temperature sensor.

The communication component 816 is configured to facilitate communication, wired or wirelessly, between the apparatus 800 and other devices. The apparatus 800 can access a wireless network based on a communication standard, such as WiFi, 2G, or 3G, or a combination thereof. In one exemplary embodiment, the communication component 816 receives a broadcast signal or broadcast associated information from an external broadcast management system via a broadcast channel. In one exemplary embodiment, the communication component 816 further includes a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth (BT) technology, and other technologies.

In exemplary embodiments, the apparatus 800 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing the above described methods.

In exemplary embodiments, there is also provided a non-transitory computer-readable storage medium including instructions, such as those included in the memory 804, executable by the processor 820 in the apparatus 800, for performing the above-described methods. For example, the non-transitory computer-readable storage medium may be a ROM, a RAM, a CD-ROM, a magnetic tape, a floppy disc, an optical data storage device, and the like.

According to the present disclosure, by sampling a plurality of groups of electricity parameters at the set sampling time interval, determining the average power of each smart switch according to the electricity parameters, and then determining the electricity consumption of each smart switch according to the average power and the working period of the smart switch, the electricity consumption of one or more electronic devices controlled by respective smart switches can be counted automatically using one smart electricity meter and a plurality of smart switches. Thus, the number of required smart electricity meters may be reduced and the cost thereof may be decreased. Moreover, manual reading and statistical analysis may be eliminated, making life more convenient.

The person skilled in the art easily anticipates other solutions after consideration of the above description and implementation of the present disclosure. The present disclosure intends to cover any variation, usage, or modification which follow a general principle of the present disclosure and include common knowledge or usual technical means in the art.

It will be appreciated that the above embodiments are exemplary and the present disclosure is not limited thereto, and that various modifications and changes can be made without departing from the scope thereof. It is intended that the scope of the invention only be limited by the appended claims.

What is claimed is:

1. A method for counting electricity consumption, comprising:
   obtaining a plurality of groups of electricity parameters, each of the groups of electricity parameters including a reading of a smart electricity meter and corresponding statuses of smart switches connected to the smart electricity meter;
   determining an average power of at least one of the smart switches according to at least one of the plurality of groups of electricity parameters;
   determining a working period of the at least one of the smart switches within a set counting period;
   determining an electricity consumption of the at least one of the smart switches in the counting period according to the working period and the average power of the at least one of the smart switches; and
   displaying the electricity consumption on a screen via a user interface,
   wherein determining the average power of the at least one of the smart switches includes:
      selecting at least two first groups of electricity parameters from the plurality of groups of electricity parameters, the at least two first groups of electricity parameters being sampled successively, and the status of each of the smart switches remaining unchanged in the first groups of electricity parameters;

determining a first overall average power according to the readings of the smart electricity meter in the first groups of electricity parameters;

selecting at least two second groups of electricity parameters from the plurality of groups of electricity parameters, the at least two second groups of electricity parameters being sampled successively, the status of each of the smart switches remaining unchanged in the second groups of electricity parameters, and the status of the at least one of the smart switches in the second groups of electricity parameters being different from the status of the at least one of the smart switches in the first groups of electricity parameters;

determining a second overall average power according to the readings of the smart electricity meter in the second groups of electricity parameters; and determining the average power of the at least one of the smart switches according to the first overall average power and the second overall average power.

2. The method according to claim 1, wherein determining the working period of the at least one of the smart switches includes:

detecting whether a turning-on instruction for turning on the at least one of the smart switches is received;

turning on the at least one of the smart switches when the turning-on instruction is detected;

starting timing of a timer corresponding to the at least one of the smart switches;

detecting whether a turning-off instruction for turning off the at least one of the smart switches is received;

turning off the at least one of the smart switches when the turning-off instruction is detected;

stopping timing of the timer; and determining whether the counting period has ended, and if so:

taking a reading of the timer; and determining the working period of the at least one of the smart switches according to the reading of the timer.

3. An apparatus for counting electricity consumption, comprising:

a processor; and a non-transitory computer-readable storage medium storing instructions that, when executed by the processor, cause the processor to:

obtain a plurality of groups of electricity parameters, each of the groups of electricity parameters including a reading of a smart electricity meter and corresponding statuses of smart switches connected to the smart electricity meter;

determine an average power of at least one of the smart switches according to at least one of the plurality of groups of electricity parameters, the average power being determined by:

selecting at least two first groups of electricity parameters from the plurality of groups of electricity parameters, the at least two first groups of electricity parameters being sampled successively, and the status of each of the smart switches remaining unchanged in the first groups of electricity parameters;

determining a first overall average power according to the readings of the smart electricity meter in the first groups of electricity parameters;

selecting at least two second groups of electricity parameters from the plurality of groups of electricity parameters, the at least two second groups of electricity parameters being sampled successively, the status of each of the smart switches remaining unchanged in the second groups of electricity parameters, and the status of the at least one of the smart switches in the second groups of electricity parameters is different from the status of the at least one of the smart switches in the first groups of electricity parameters;

determining a second overall average power according to the readings of the smart electricity meter in the second groups of electricity parameters; and determining the average power of the at least one of the smart switches according to the first overall average power and the second overall average power;

determine a working period of the at least one of the smart switches within a set counting period; and determine an electricity consumption of the at least one of the smart switches in the counting period for display on a screen via a user interface, the electricity consumption being determined according to the working period and the average power of the at least one of the smart switches.

4. The apparatus according to claim 3, wherein the instructions causing the processor to determine the working period include instructions causing the processor to:

detect whether a turning-on instruction for turning on the at least one of the smart switches is received;

turn on the at least one of the smart switches when the turning-on instruction is detected;

start timing of a timer corresponding to the at least one of the smart switches;

detect whether a turning-off instruction for turning off the at least one of the smart switches is received;

turn off the at least one of the smart switches when the turning-off instruction is detected;

stop timing of the timer; and determine whether the counting period has ended, and if so:

take a reading of the timer; and determine the working period of the at least one of the smart switches according to the reading of the timer.

5. A non-transitory computer-readable storage medium storing instructions that, when executed by one or more processors, cause the one or more processors to:

obtain a plurality of groups of electricity parameters, each of the groups of electricity parameters including a reading of a smart electricity meter and corresponding statuses of smart switches connected to the smart electricity meter;

determine an average power of at least one of the smart switches according to at least one of the plurality of groups of electricity parameters, the average power being determined by:

selecting at least two first groups of electricity parameters from the plurality of groups of electricity parameters, the at least two first groups of electricity parameters being sampled successively, and the status of each of the smart switches remaining unchanged in the first groups of electricity parameters;

determining a first overall average power according to the readings of the smart electricity meter in the first groups of electricity parameters;

selecting at least two second groups of electricity parameters from the plurality of groups of electricity parameters, the at least two second groups of electricity parameters being sampled successively, the status of each of the smart switches remaining unchanged in the second groups of electricity parameters, and the status of the at least one of the smart switches in the second groups of electricity parameters is different from the status of the at least one of the smart switches in the first groups of electricity parameters;

determining a second overall average power according to the readings of the smart electricity meter in the second groups of electricity parameters; and determining the average power of the at least one of the smart switches according to the first overall average power and the second overall average power;

determine a working period of the at least one of the smart switches within a set counting period; and determine an electricity consumption of the at least one of the smart switches in the counting period for display on a screen via a user interface, the electricity consumption being determined according to the working period and the average power of the at least one of the smart switches.

\* \* \* \* \*